(12) United States Patent
Hung et al.

(10) Patent No.: US 12,132,484 B2
(45) Date of Patent: Oct. 29, 2024

(54) VOLTAGE HOLDING DEVICE AND ELECTRONIC APPARATUS USING THE SAME

(71) Applicant: NUVOTON TECHNOLOGY CORPORATION, Hsinchu (TW)

(72) Inventors: Wei Min Hung, Hsinchu (TW); Hsin Hung Chen, Hsinchu (TW)

(73) Assignee: NUVOTON TECHNOLOGY CORPORATION, Hsinchu (TW)

( * ) Notice: Subject to any disclaimer, the term of this patent is extended or adjusted under 35 U.S.C. 154(b) by 8 days.

(21) Appl. No.: 18/167,650

(22) Filed: Feb. 10, 2023

(65) Prior Publication Data
US 2024/0048129 A1  Feb. 8, 2024

(30) Foreign Application Priority Data
Aug. 3, 2022 (TW) .................... 111129102

(51) Int. Cl.
*H03K 3/02* (2006.01)
*H03K 3/012* (2006.01)
*H03K 3/0233* (2006.01)

(52) U.S. Cl.
CPC ......... *H03K 3/02337* (2013.01); *H03K 3/012* (2013.01)

(58) Field of Classification Search
CPC .. H03K 3/02337; H03K 3/012; H03K 3/0231; H03K 3/023; G11C 29/021; G11C 29/50; G11C 2029/5004; G11C 27/026; G11C 29/50004
See application file for complete search history.

(56) References Cited

U.S. PATENT DOCUMENTS

2018/0269893 A1* 9/2018 Chang ................ H03M 1/0682

* cited by examiner

*Primary Examiner* — Jung Kim
(74) *Attorney, Agent, or Firm* — MUNCY, GEISSLER, OLDS & LOWE, P.C.

(57) ABSTRACT

Whether a voltage difference reaches a hysteresis voltage of a hysteresis comparator is used to efficiently update a charge of a capacitor and achieve lower power consumption. On the other hand, since the advanced voltage holding circuit is designed to consume lower power, the refresh time must be designed longer, which makes it impossible to do a large number of yield tests. Thus, the test time in conjunction with the relevant application circuit can be greatly shortened, and the testability and reliability of a voltage holding device can be increased.

18 Claims, 7 Drawing Sheets

VOLTAGE HOLDING DEVICE AND ELECTRONIC APPARATUS USING THE SAME

CROSS-REFERENCE TO RELATED APPLICATION

This application claims the priority from the TW Patent Application No. 111129102, filed on Aug. 3, 2022, and all contents of such TW Patent Application are included in the present disclosure.

BACKGROUND

1. Field of the Invention

The present disclosure relates to a voltage holding device and an electronic apparatus using the same, in particular to, a voltage holding device capable of performing rapid tests and having high voltage accuracy and an electronic apparatus using the same.

2. Description of the Related Art

In the design of a conventional voltage holding circuit, a clock signal is used to refresh a charge to maintain the voltage accuracy. With the demand for higher and higher voltage accuracy, the influence of the environment on the charge makes users have to choose the shortest refresh time, so that the power consumption of the voltage holding circuit cannot be reduced efficiently. On the other hand, since the advanced voltage holding circuit is designed to consume lower power, the refresh time is designed to be longer. Thus, a large number of yield tests are hard to be performed, resulting in a decrease in the testability and reliability of the voltage holding circuit.

Refer to FIG. 1, which is a schematic circuit diagram of a conventional voltage holding circuit. A voltage holding circuit 100 includes two PMOS transistors MP1 and MP2, two capacitors C1 and C2, and two diodes D1 and D2. The PMOS transistors MP1 and MP2 are controlled by a control signal CS1, so that the PMOS transistors MP1 and MP2 are turned on or turned off. Hence, an input voltage Vin charges the capacitor C1 and a voltage Vh charges the capacitor C2. Alternatively, the capacitors C1 and C2 are discharged. The voltage holding circuit 100 outputs a voltage Nout which is held by the capacitor C2. Further, when the PMOS transistors MP1 and MP2 are turned on, the voltage Nout held by the capacitor C2 is equal to the voltage Vin. When the PMOS transistors MP1 and MP2 are turned off, the voltage Nout held by the capacitor C2 deviates from a predetermined voltage value due to a leakage current of the PMOS transistors MP1 and MP2. When the leakage current is small, even the voltage Nout held by the capacitor C2 does not deviate quickly. The voltage holding circuit 100 must use a shorter refresh time in order to ensure the requirement of high voltage accuracy. Thus, the power consumption cannot be reduced more efficiently.

Refer to FIG. 2, which is a schematic circuit diagram of a conventional voltage holding device. A voltage holding device 300 includes a voltage generating circuit 310, a reference current generating circuit 320, capacitors C1, C2, switches S1, S2, a hysteresis comparator 330 and a control logic 340. In this embodiment of the prior art, the hysteresis comparator 330 is configured to compare voltages V1 and V2, and determine whether a voltage difference reaches a hysteresis voltage V_hys of the hysteresis comparator 330 to generate a comparison result signal. The control logic 340 is configured to control the voltage Vin generated by the voltage generating circuit 310 and control the turn-on or the turn-off of the switches S1 and S2 based on the comparison result signal. The voltage generating circuit 310 is configured to generate the voltage Vin based on a reference current IREF provided by the reference current generating circuit 320 and the comparison result signal.

Refer to FIG. 2 and FIG. 3 at the same time, and FIG. 3 is a waveform diagram of some signals of the voltage holding device of FIG. 2. During a holding period t_hold, the switches S1 and S2 are turned off, a voltage value of the voltage Vin generated by the voltage generating circuit 310 is greater than a voltage value of a reference voltage V_ref. Therefore, the capacitors C1 and C2 can be charged via a leakage current of the switches S1 and S2, so that the voltage values of the voltages V1 and V2 on the capacitors C1 and C2 start to rise from the voltage value of the reference voltage V_ref. Because capacitance values of the capacitors C1 and C2 are different, the charging speeds thereof are different. Correspondingly, a voltage difference between the voltages V1 and V2 on the capacitors C1 and C2 increases with time. As well, after the voltage difference between the voltages V1 and V2 reaches the hysteresis voltage V_hys of the hysteresis comparator 330, the comparison result signal is transitioned to make the control logic 340 turn on the switches S1 and S2. Then, the voltage holding device 300 enters a sampling period t_sample. During the sampling period t_sample, the voltage value of the voltage Vin generated by the voltage generating circuit 310 is equal to the voltage value of the reference voltage V_ref, and the voltages V1 and V2 start to drop to the voltage value of the reference voltage V_ref. Next, after the voltages V1 and V2 drop to the voltage value of the reference voltage V_ref, the comparison result signal is transitioned to make the control logic 340 turn off the switches S1 and S2. Also, the voltage holding device 300 enters the holding period t_hold again.

During the holding period t_hold, the leakage current of the of the switches S1 and S2 charge the capacitors C1 and C2 to make the voltages V1 and V2 both rise. Moreover, the voltage difference between the voltages V1 and V2 must reach the hysteresis voltage V_hys to make the comparison result signal of the hysteresis comparator 330 be transitioned. Thus, the voltage holding device 300 needs to take a long time to hold voltage, which makes the refresh speed be reduced. Further, the voltage V1 must rise to a certain voltage value to make the voltage difference between the voltages V1 and V2 reach the hysteresis voltage V_hys. Therefore, the voltage generating circuit 310 must output a higher voltage Vin to charge the capacitors C1 and C2. In FIG. 2 and FIG. 3, assuming that the voltage value of the reference voltage V_ref is 1.2 volts, a voltage value of the voltage provided by a low-dropout regulator (LDO) must be 1.5 times 1.2 volts, that is, 1.8 volts. Assuming that the capacitance value of the capacitor C2 is designed to be 10 times the capacitance value of the capacitor C1, the hysteresis voltage V_hys is 50 mV, the leakage current through the switch S1 is 0.12 times the leakage current through the switch S2, and the maximum voltage value of the voltage V2 is 1.45 volts. It means that the low-dropout regulator must output a supply voltage of 2.175 volts, which exceeds 110% of 1.8 volts, 1.98 volts. As a result, the implementation of the voltage holding device 300 may cause the low-dropout regulator which is operated at a low voltage to be burned out.

SUMMARY

An embodiment of the present disclosure provides a voltage holding device. The voltage holding device comprises a first voltage holding circuit, a second voltage holding circuit, a first input-end voltage selection device, a second input-end voltage selection device and a voltage difference detector. The first voltage holding circuit includes a first capacitor, a first input end and a first output end, and the first output end is configured to generate a first voltage. Besides, the first capacitor is electrically connected between a low voltage and the first output end, and a switch control signal is configured to turn on or off the first input end and the first output end. The second voltage holding circuit includes a second capacitor, a second input end and a second output end, and the second output end is configured to generate a second voltage. Besides, the second capacitor is electrically connected between the low voltage and the second output end, and t the switch control signal is configured to turn on or off the second input end and the second output end. The first input-end voltage selection device is electrically connected to the first input end, and the first input-end voltage selection device is configured to selectively provide one of a reference voltage, a test reference voltage and a system high voltage to the first input end as a first input voltage. The second input-end voltage selection device is electrically connected to the second input end, and the second input-end voltage selection device is configured to selectively provide one of a system low voltage and the reference voltage to the second input end as a second input voltage. The voltage difference detector is electrically connected to the first voltage holding circuit and the second voltage holding circuit. The voltage difference detector is configured to detect a voltage difference between the first voltage and the second voltage, and generate the switch control signal based on the voltage difference.

An embodiment of the present disclosure also provides an electronic apparatus using the preceding voltage holding device. The electronic apparatus comprises the preceding voltage holding device and a system circuit, and the system circuit is electrically connected to the voltage holding device.

To sum up, compared with the related art, the voltage holding device provided by the present disclosure has lower power consumption. Moreover, the embodiments of the present disclosure can increase the testability and reliability of the voltage holding device. Furthermore, the voltage holding device of the present disclosure allows the use of low-dropout regulators operating at low voltages and the low-dropout regulators is prevented from burning out.

To further understand the technology, means, and effects of the present disclosure, reference may be made by the detailed description and drawing as follows. Accordingly, the purposes, features and concepts of the present disclosure can be thoroughly and concretely understood. However, the following detail description and drawings are only used to reference and illustrate the implementation of the present disclosure, and they are not used to limit the present disclosure.

BRIEF DESCRIPTION OF THE DRAWINGS

The drawings are provided to make the persons with ordinary knowledge in the field of the art further understand the present disclosure, and are incorporated into and constitute a part of the specification of the present disclosure. The drawings illustrate demonstrated embodiments of the present disclosure, and are used to explain the principal of the present disclosure together with the description of the present disclosure.

DESCRIPTION OF THE PREFERRED EMBODIMENTS

Figure 1:
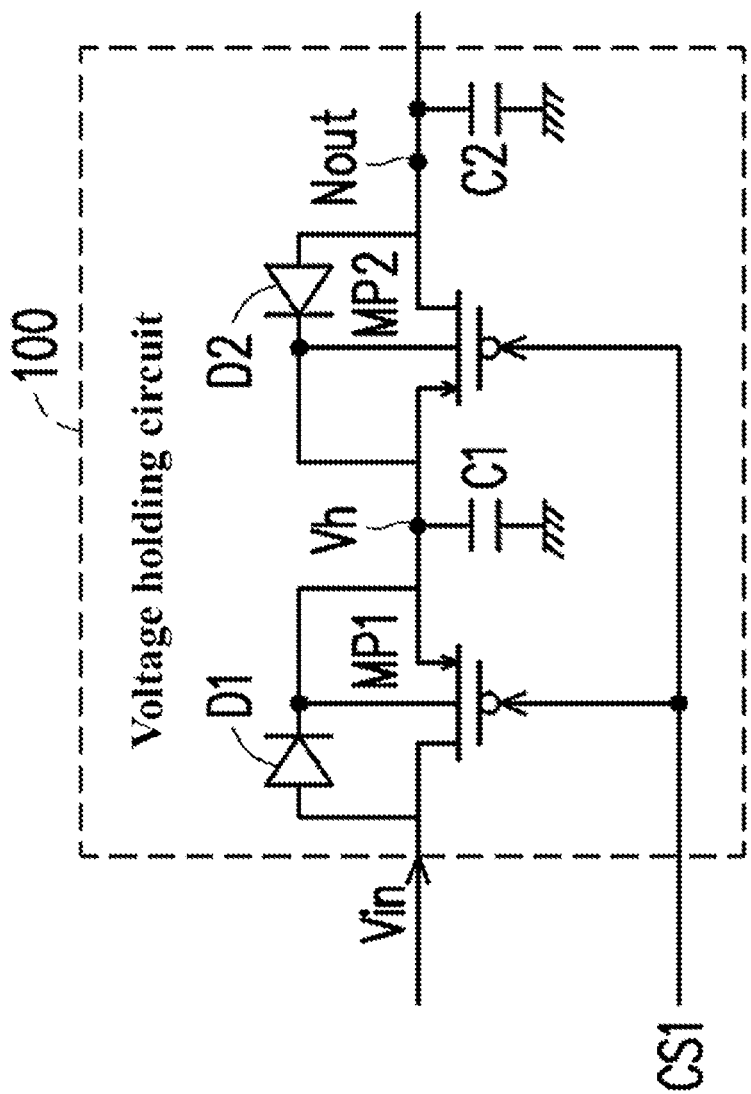
FIG. 1 is a schematic circuit diagram of a conventional voltage holding device.
Figure 2:
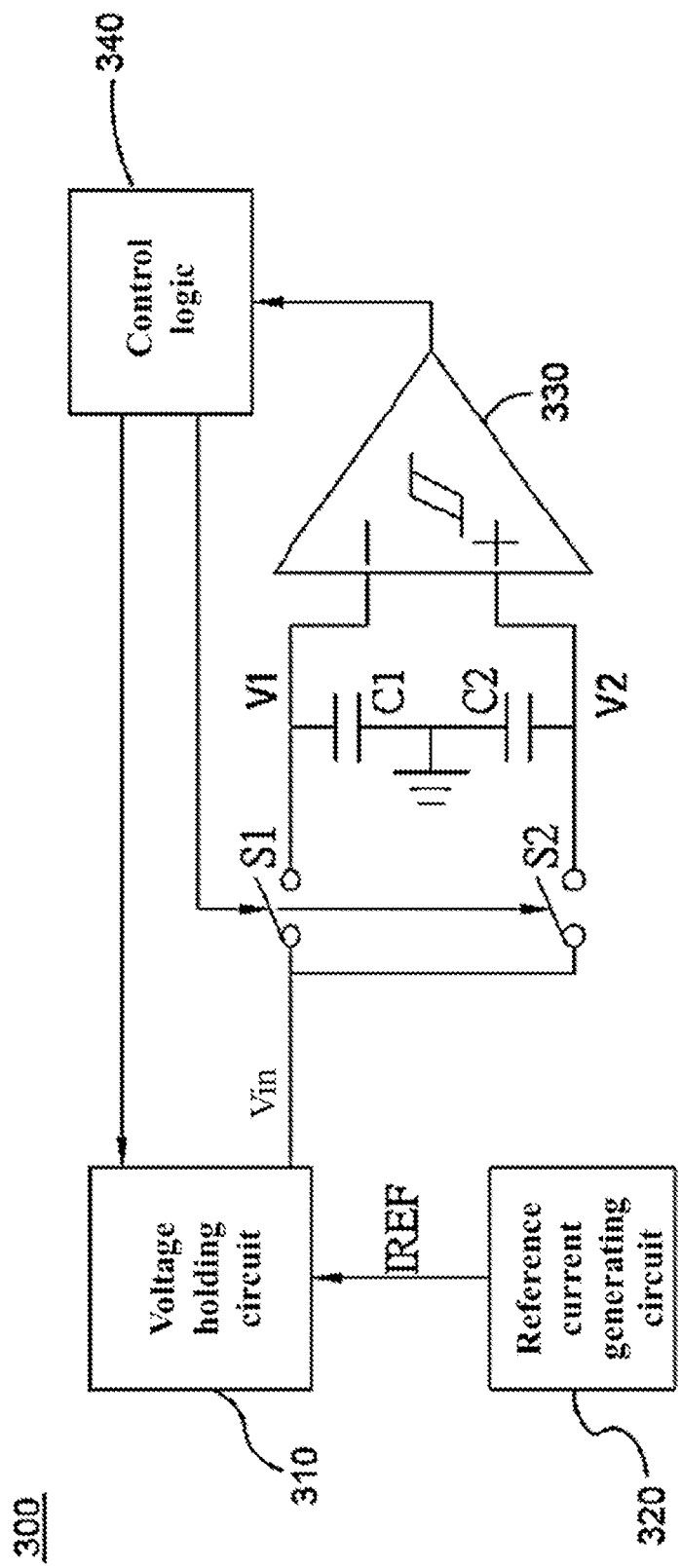
FIG. 2 is a schematic circuit diagram of a conventional voltage holding device.
Figure 3:
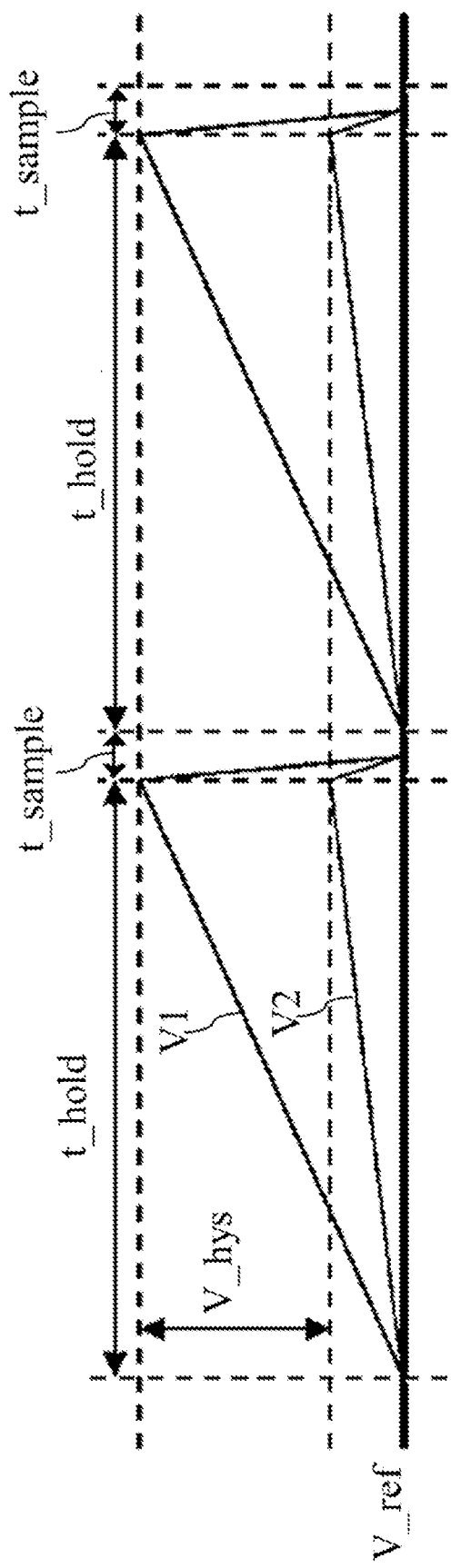
FIG. 3 is a waveform diagram of some signals of the voltage holding device of FIG. 2.

The embodiments of the present disclosure are described in detail as reference, and the drawings of the present disclosure are illustrated. In the case of possibility, the element symbols are used in the drawings to refer to the same or similar components. In addition, the embodiment is only one approach of the implementation of the design concept of the present disclosure, and the following multiple embodiments are not intended to limit the present disclosure.

In order to solve the problems of the related art, the technical solutions proposed by the present disclosure is to efficiently update a charge of a capacitor based on whether a voltage difference reaches to a hysteresis voltage of a hysteresis comparator, so that lower power consumption is achieved. On the other hand, the refresh time has to be designed longer because the advanced voltage holding device is designed for lower power consumption, which results in being hard to do a large number of yield tests. In view of the problems mentioned above, the technical solutions proposed by the present disclosure can greatly shorten the test time in conjunction with the relevant application circuit, and increase the testability and reliability of the voltage holding device.

Further, the technical solutions proposed by the present disclosure use two voltage holding circuits. The two voltage holding circuits use two currents in the same direction to charge/discharge two capacitors, respectively. Then, a voltage difference detector, such as a hysteresis comparator, is used to detect a voltage difference between the two voltage holding circuits. Besides, a hysteresis voltage of the hysteresis comparator can be set based on the required holding voltage accuracy. Afterwards, switches of the two voltage holding circuits are switched by a switch control signal generated by the voltage difference detector, so as to update charges of the two capacitors. Thus, when the currents charge the capacitors, and the capacitors are affected by the process, voltage and temperature (PVT), the refresh time is also adjusted accordingly. In other words, the technical solutions proposed by the present disclosure can maintain high voltage accuracy by depending on the accurate hysteresis voltage. Furthermore, during the test, the two voltage holding circuits and the two large currents in the same direction are used to directly measure whether the designed hysteresis voltage of the voltage difference detector meets the expectations. That is, the amount of voltage variation is directly determined, so as to quickly detect whether the voltage accuracy is suitable for use.

Figure 4:
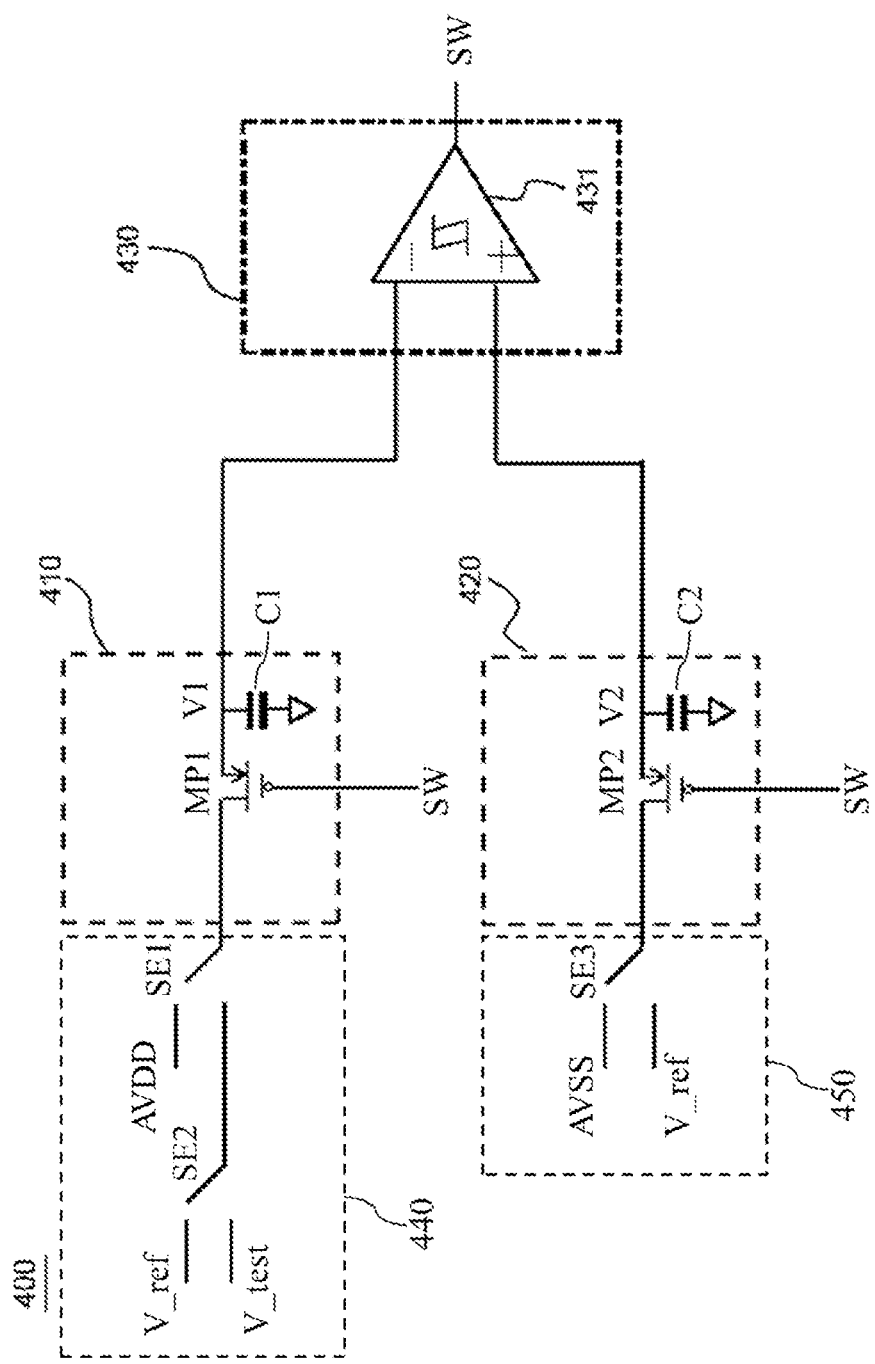
FIG. 4 is a schematic circuit diagram of a voltage holding device according to an embodiment of the present disclosure.

Firstly, refer to FIG. 4, which is a schematic circuit diagram of a voltage holding device according to an embodiment of the present disclosure. The voltage holding device 400 includes voltage holding circuits 410, 420, a voltage difference detector 430 and input-end voltage selection devices 440 and 450. The voltage holding device 400 can operate in an operation mode or a test mode. In the operation mode, the voltage holding device 400 is in a normal operation. The voltage holding device 400 is configured to sample and hold, so that a steady-state reference voltage V_ref of an output end of the voltage holding circuit 410 and an output end of the voltage holding circuit 420 can be sampled. Also, the voltage holding device 400 maintains the high voltage accuracy by controlling the voltage holding circuits 410 and 420 by the voltage difference detector 430. In the test mode, the voltage holding device 400 is in a detection operation. The voltage holding device 400 is configured to quickly detect whether the voltage accuracy is suitable for use.

The voltage holding circuit 410 includes a capacitor C1, an input end and the output end, and the output end of the voltage holding circuit 410 is configured to generate a voltage V1. The capacitor C1 is electrically connected between a low voltage (such as a ground voltage) and the output end of the voltage holding circuit 410. Also, turning on/off the input end and the output end of the voltage holding circuit 410 is determined by a switch control signal SW. For example, turning on/off the input end and the output end of the voltage holding circuit 410 is implemented by using the switch control signal SW to control a PMOS transistor MP1, wherein the PMOS transistor MP1 is disposed between the input end and the output end of the voltage holding circuit 410. Moreover, a drain of the PMOS transistor MP1 is configured as the input end of the voltage holding circuit 410, a gate of the PMOS transistor MP1 is configured to receive the switch control signal SW, and a source of the PMOS transistor MP1 is configured as is configured as the output end of the voltage holding circuit 410. The PMOS transistor MP1 may be implemented by other types of transistors or switches, and the present disclosure is not limited thereto.

The voltage holding circuit 420 includes a capacitor C2, an input end and the output end, and the output end of the voltage holding circuit 420 is configured to generate a voltage V2. The capacitor C2 is electrically connected between the low voltage and the output end of the voltage holding circuit 420. Also, turning on/off the input end and the output end of the voltage holding circuit 420 is determined by the switch control signal SW. For example, turning on/off the input end and the output end of the voltage holding circuit 410 is implemented by using the switch control signal SW to control a PMOS transistor MP2, wherein the PMOS transistor MP2 is disposed between the input end and the output end of the voltage holding circuit 420. In addition, a drain of the PMOS transistor MP2 is configured as the input end of the voltage holding circuit 420, a gate of the PMOS transistor MP2 is configured to receive the switch control signal SW, and a source of the PMOS transistor MP2 is configured as the output end of the voltage holding circuit 420. The PMOS transistor MP2 may be implemented by other types of transistors or switches, and the present disclosure is not limited thereto.

The voltage difference detector 430 is electrically connected to the voltage holding circuits 410 and 420. The voltage difference detector 430 is configured to detect a voltage difference between the voltages V1 and V2, and the voltage difference detector 430 is configured to generate the switch control signal SW based on the voltage difference. The voltage difference detector 430 may be a hysteresis comparator 431, and the voltage difference detector 430 has a hysteresis voltage V_hys. When the voltage difference rises from 0 to the hysteresis voltage V_hys, the switch control signal SW output by the voltage difference detector 430 changes from a logic high level to a logic low level. Besides, a period of the voltage difference rising from 0 to the hysteresis voltage V_hys is defined as a holding period. When the voltage difference decreases from a voltage value of the hysteresis voltage V_hys to 0, the switch control signal SW output by the voltage difference detector 430 changes from the logic low level to the logic high level. In addition, a period of the voltage difference decreasing from the voltage value of the hysteresis voltage V_hys to 0 is defined as a sampling period. Of course, the present disclosure is not limited to the implementation of the hysteresis comparator 431 as the voltage difference detector 430, and other types of voltage difference detection devices may also be used to implement the function of the voltage difference detector 430.

The input-end voltage selection device 440 is electrically connected to the input end of the voltage holding circuit 410. The input-end voltage selection device 440 is configured to select one of a reference voltage V_ref, a test reference voltage V_test and a system high voltage AVDD as an input voltage for the input end of the voltage holding circuit 410. The input-end voltage selection device 440 comprises selectors SE1 and SE2. An output end of the selector SE1 is electrically connected to the input end of the voltage holding circuit 410. One of input ends of the elector SE1 is electrically connected to the system high voltage AVDD, and the other of the input ends of the elector SE1 is electrically connected to an output end of the selector SE2. As well, one of input ends of the selector SE2 is electrically connected to the reference voltage V_ref, and the other of the input ends of the selector SE2 is electrically connected to the test reference voltage V_test. In other embodiments, the combination of the selectors SE1 and SE2 may be implemented by using a selector having three input ends and one output end instead. All in all, the implementation of the input-end voltage selection device 440 is not intended to limit the present disclosure.

The input-end voltage selection device 450 is electrically connected to the input end of the voltage holding circuit 420. The input-end voltage selection device 450 is configured to select one of a system low voltage AVSS and the reference voltage V_ref as an input voltage for the input end of the voltage holding circuit 420. The input-end voltage selection device 450 includes a selector SE3. An output end of the selector SE3 is electrically connected to the input end of the voltage holding circuit 420. One of input ends of the selector SE3 is electrically connected to the system low voltage AVSS, and the other of the input ends of the selector SE3 is electrically connected to the reference voltage V_ref.

Figure 5:
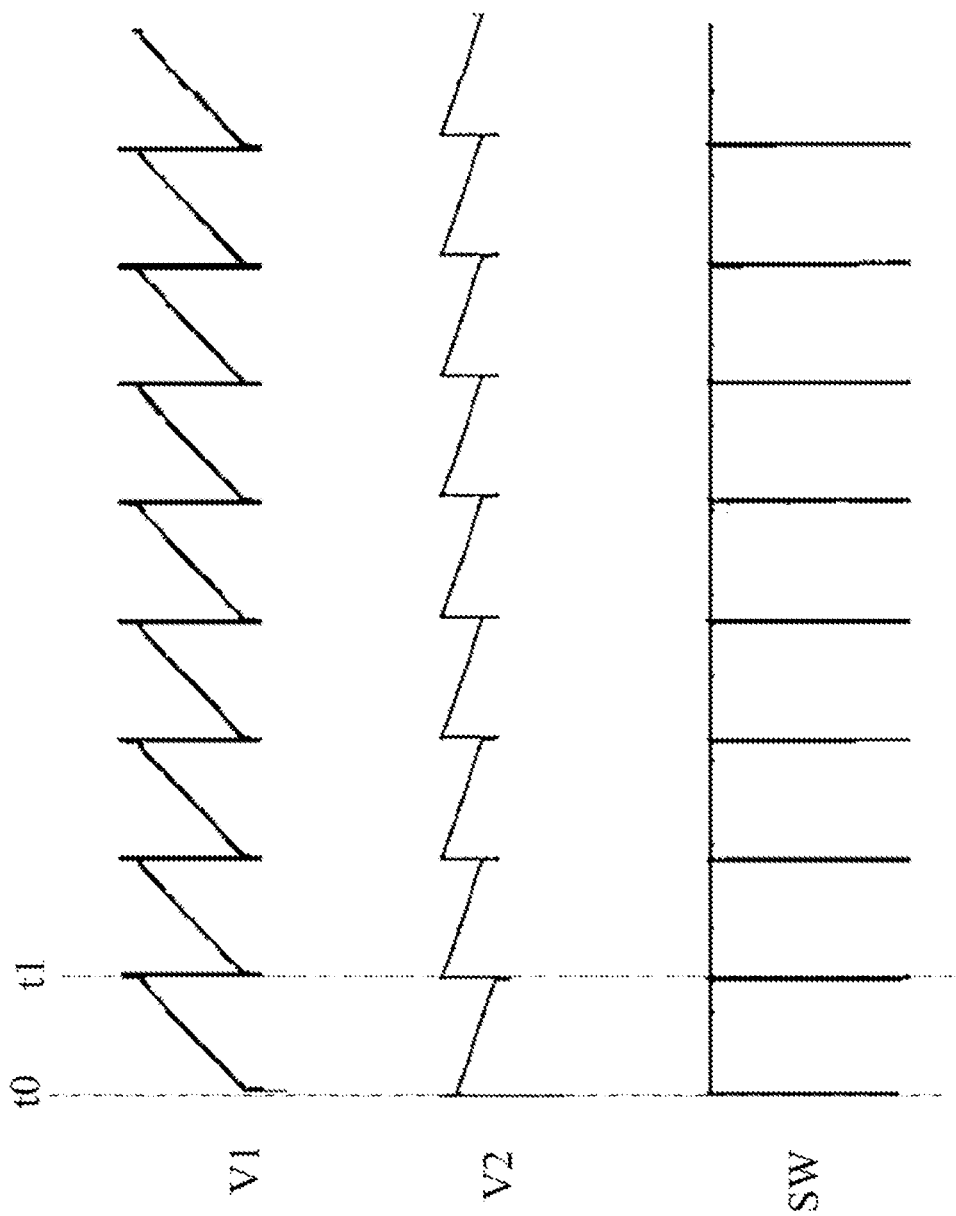
FIG. 5 is a waveform diagram of some signals of a voltage holding device in an operation mode according to an embodiment of the present disclosure.
Figure 7:
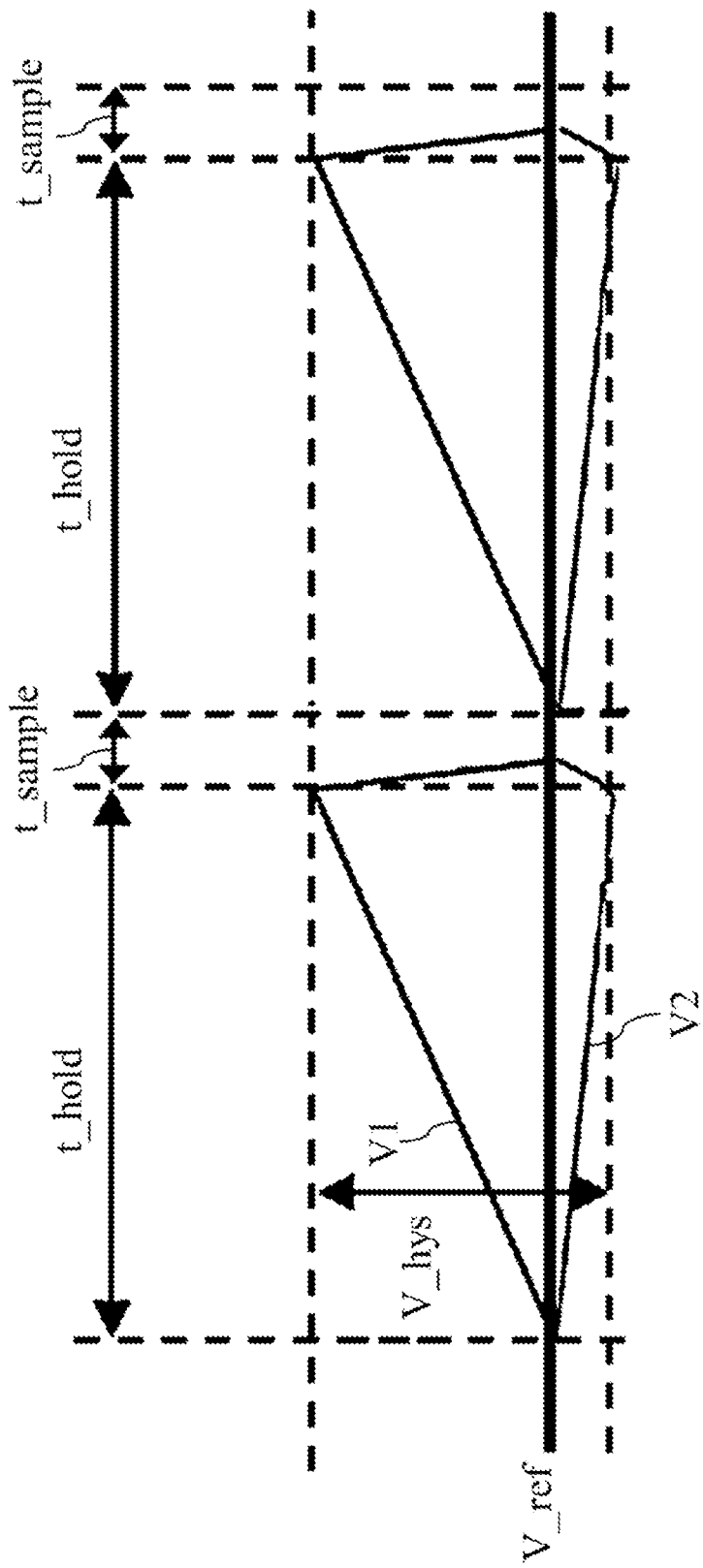
FIG. 7 is another wave diagram of some signals the voltage holding device in the operation mode according to an embodiment of the present disclosure.

Refer to FIG. 4 and FIG. 5 at the same time, FIG. 5 is a waveform diagram of some signals of a voltage holding device according to an embodiment of the present disclosure. In the operation mode, the voltage V1 of the voltage holding device 400 rises from the reference voltage V_ref between a time point t0 and a time point t1, and the voltage V2 of the voltage holding device 400 drops from the reference voltage V_ref between the time point t0 and the time point t1. The period between the time point t0 and the time point t1 is defined as the holding period. During the holding period, the switch control signal SW is at the logic high level to turn off the PMOS transistors MP1 and MP2. The drain of the PMOS transistor MP1 is electrically connected to the system high voltage AVDD via the selector SE1, and the drain of the PMOS transistor MP2 is electrically connected to the system low voltage AVSS via the selector SE3. In this way, the leakage current of the PMOS transistor MP1 charges the capacitor C1 via the system high voltage AVDD, and the leakage current of the PMOS transistor MP2 discharges the capacitor C2 via the system low voltage AVSS. Consequently, between the time point t0 and the time point t1, the voltage V1 rises and the voltage V2 drops. At the time point t1, the voltage difference between the voltages V1 and V2 reaches to the hysteresis voltage V_hys, so that the switch control signal SW changes from the logic high level to the logic low level. Thus, the PMOS transistors MP1 and MP2 are turned on. Then, a short period after the time point t1 (the details are shown in FIG. 7) is defined as the sampling period t_sample. During the sampling period t_sample, the voltage V1 drops to the reference voltage V_ref, and the voltage V2 rises to the reference voltage V_ref. Thus, the sampled voltages V1 and V2 are the reference voltage V_ref. When the voltages V1 and V2 are the reference voltage V_ref, the switch control signal SW becomes the logic high level. Then, the sampling period t_sample ends, and the holding period t_hold is entered again.

Please continuously refer to FIG. 4, in the test mode, the switch control signal SW is forced to be the logic low level. Therefore, the input end and the output end of the voltage holding circuit 410 are turned on, that is, the PMOS transistor MP1 is turned on, and the input end and the output end of the voltage holding circuit 420 are turned on, that is, the PMOS transistor MP2 is turned on. The input-end voltage selection device 440 selects the system high voltage AVDD as the input voltage of the voltage holding circuit 410. As well, the input-end voltage selection device 450 selects the system low voltage AVSS as the input voltage of the voltage holding circuit 420. As a result, a first test is performed. The first test includes testing whether the selector SE1 of the input-end voltage selection device 440 is normal, testing whether the selector SE3 of the input-end voltage selection device 450 is normal, and testing whether the voltage difference detector 430 is normal. In normal operation, the voltage V1 rises and the voltage V2 drops, so that the voltage difference reaches the hysteresis voltage V_hys and the switch control signal SW becomes the logic high level. In addition, the first test further includes simultaneously testing whether the PMOS transistors MP1, MP2, the capacitors C1 and C2 are normal.

After the first test is performed, next, the switch control signal SW is still forced to be the logic low level. Moreover, the input-end voltage selection device 440 selects the reference voltage V_ref as the input voltage of the voltage holding circuit 410, and the input-end voltage selection device 450 selects the reference voltage V_ref as the input voltage of the voltage holding circuit 420. As a result, a second test is performed. The second test includes testing whether the selector SE1 of the input-end voltage selection device 440 is normal, testing whether the selector SE2 and the selector SE3 of the input-end voltage selection device 450 is normal, and testing whether the voltage difference detector 430 is normal. In normal operation, the voltages V1 and V2 are held at the reference voltage V_ref, and the switch control signal SW is maintained at the logic low level. In addition, the second test further includes simultaneously testing whether the PMOS transistors MP1, MP2, the capacitors C1 and C2 are normal.

Figure 6:
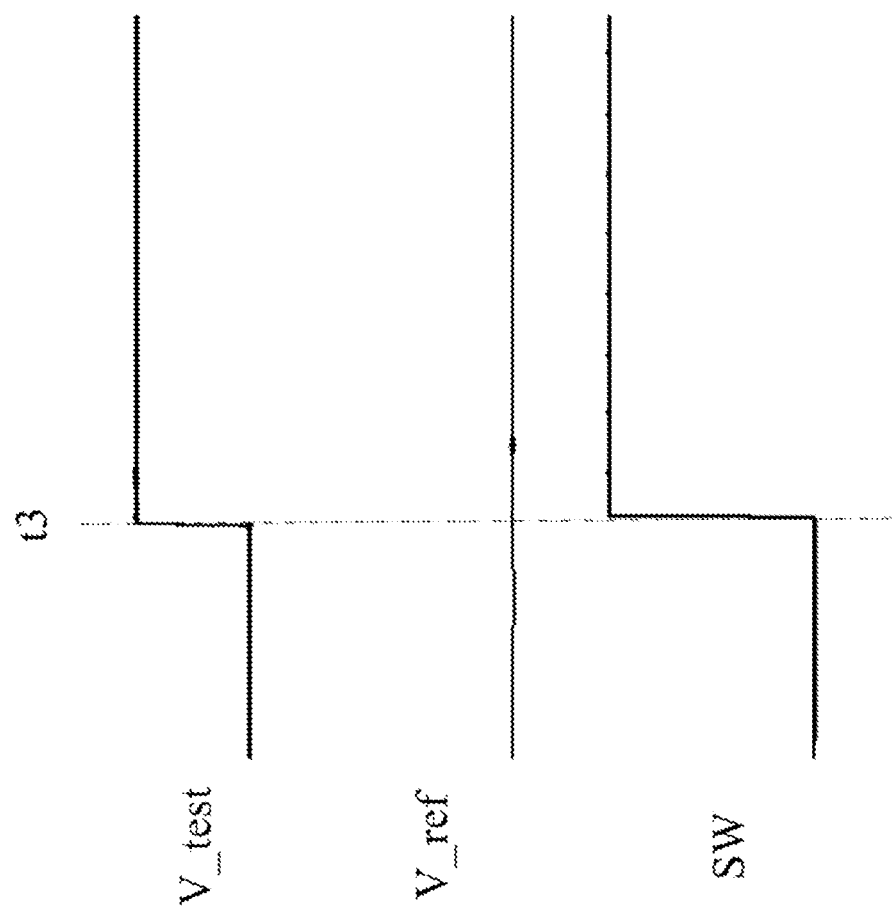
FIG. 6 is a waveform diagram of some signals of a voltage holding device in a test mode according to an embodiment of the present disclosure.

Next, please refer to FIG. 4 and FIG. 6 at the same time, and FIG. 6 is a waveform diagram of some signals of a voltage holding device in a test mode according to an embodiment of the present disclosure. As shown in FIG. 6, in the test mode, after the first test and the second test are performed, at a time point t3, the switch control signal SW is forced to be the logic high level, and the test reference voltage V_test becomes the logic high level. Also, the input-end voltage selection device 440 selects the test reference voltage V_test and input the test reference voltage V_test to the voltage holding circuit 410, and the input-end voltage selection device 420 selects the reference voltage V_ref and input the reference voltage V_ref to the voltage holding circuit 420. As a result, a third test is performed. The third test includes testing whether the selectors SE1 and SE2 of the input-end voltage selection device 440 is normal, testing whether the selector SE3 of the input-end voltage selection device 450 is normal, testing whether the voltage difference detector 430 is normal, and testing whether the hysteresis voltage V_hys of the voltage difference detector 430 deviates from a predetermined value. In addition, the third test further includes simultaneously testing whether the PMOS transistors MP1, MP2, the capacitors C1 and C2 are normal.

By the preceding first test, second test and third test, it is able to quickly find out whether the selectors SE1, SE2, SE3, capacitors C1, C2 and the voltage difference detector 430 operate normally on an operating path as expected. Different from the test of the related art, which takes a long time, the structure of the voltage holding device 400 of the present disclosure simplified the test and does not take much time. Therefore, the testability and reliability of the voltage holding device 400 can be improved.

Please refer to FIG. 4 and FIG. 7 at the same time, and FIG. 7 is another wave diagram of some signals the voltage holding device in the operation mode according to the embodiment of the present disclosure. The waveform diagram of FIG. 7 is actually an enlarged schematic diagram of the waveform of FIG. 5. In the operation mode, when the voltage difference decreases from the hysteresis voltage V_hys to 0, the holding period t_hold is entered. During the holding period t_hold, the voltage difference detector 430 generates the switch control signal SW to turn off the PMOS transistors MP1 and MP2. The input-end voltage selection device 440 selects the system high voltage AVDD as the input voltage of the voltage holding circuit 410. The input-end voltage selection device 450 selects the system low voltage AVSS as the input voltage of the voltage holding circuit 420. Thus, the capacitor C1 is charged and the capacitor C2 is discharged via the two leakage currents. Besides, the leakage current of the PMOS transistor MP1 of the voltage holding circuit 410 and the leakage current of the PMOS transistor MP2 of the voltage holding circuit 420. As a result, the voltage V1 rises from the reference voltage V_ref and the voltage V2 drops from the reference voltage V_ref. As well, the voltage difference increases from 0 to the hysteresis voltage V_hys.

After the voltage difference increases from 0 to the hysteresis voltage V_hys, the sampling period t_sample is entered. During the sampling period t_sample, the voltage difference detector 430 generates the switch control signal SW to turn on the PMOS transistors MP1 and MP2. The input-end voltage selection device 440 selects the reference voltage V_ref as the input voltage of the voltage holding circuit 410. The input-end voltage selection device 450 selects the reference voltage V_ref as the input voltage of the voltage holding circuit 420. Thus, the voltage V1 drops to the reference voltage V_ref, and the voltage V2 rises to the reference voltage V_ref. Also, the voltage difference decreases from the hysteresis voltage V_hys to 0. Then, the sampling period t_sample ends, the holding period t_hold is entered, and so on.

Furthermore, in an embodiment of the present disclosure, assuming that a voltage value of the reference voltage V_ref is 1.2 volts, a voltage value of the voltage provided by a low-dropout regulator (LDO) have to be 1.5 times of 1.2 volts, that is, 1.8 volts. If a capacitance value of the designed capacitor C2 is 10 times a capacitance of the capacitor C2, the hysteresis voltage V_hys is 50 mV, and the leakage current through the PMOS transistor MP1 is 0.12 times the leakage current through the PMOS transistor MP2, the maximum voltage value of the voltage V2 is 1.223 volts. It means that the low-dropout regulator must output a supply voltage of 1.835 volts, which does not exceed 110% of 1.8 volts, 1.98 volts. Therefore, the implementation of the voltage holding device 400 may not cause the low-dropout regulator operating at a low voltage to be burned out.

By the way, an embodiment of the present disclosure also provides an electronic apparatus using the preceding voltage holding device 400. The electronic apparatus includes the preceding voltage holding device 400 and a system circuit, and the system circuit is electrically connected to the voltage holding device 400. The system circuit may be any form of functional chip or circuit depending on the type of the electronic apparatus, and the present disclosure is not limited thereto.

As the stated as above, the voltage holding device provided by the embodiments of the present disclosure has the following advantages. Firstly, the amount of voltage change (i.e., the aforementioned voltage difference) is less than the hysteresis voltage of the voltage difference detector, so that the voltage holding device can maintain a high-accuracy voltage without changing with external factors (such as process, voltage and temperature). Secondly, during the test, all the components on the operation path can be quickly tested whether working normally. Thirdly, during the test, it only needs to ensure that the hysteresis voltage of the voltage difference detector meets the requirements, so that the voltage change is definitively less than the hysteresis voltage of the voltage difference detector. Further, the voltage holding device achieves the required voltage accuracy. As well, it is not necessary to make the operation conversion to know whether the voltage holding device can achieve the required voltage accuracy. As a result, the test time and cost can be reduced.

It should be understand that the examples and the embodiments described herein are for illustrative purpose only, and various modifications or changes in view of them will be suggested to those skilled in the art, and will be included in the spirit and scope of the application and the appendix with the scope of the claims.

What is claimed is:

1. A voltage holding device, comprising:
    a first voltage holding circuit, comprising a first capacitor, a first input end and a first output end, wherein the first output end is configured to generate a first voltage, wherein the first capacitor is electrically connected between a low voltage and the first output end, and wherein a switch control signal is configured to turn on or off the first input end and the first output end;
    a second voltage holding circuit, comprising a second capacitor, a second input end and a second output end, wherein the second output end is configured to generate a second voltage, wherein the second capacitor is electrically connected between the low voltage and the second output end, and wherein the switch control signal is configured to turn on or off the second input end and the second output end;
    a first input-end voltage selection device, electrically connected to the first input end, and configured to selectively provide one of a reference voltage, a test reference voltage and a system high voltage to the first input end as a first input voltage;
    a second input-end voltage selection device, electrically connected to the second input end, and configured to selectively provide one of a system low voltage and the reference voltage to the second input end as a second input voltage; and
    a voltage difference detector, electrically connected to the first voltage holding circuit and the second voltage holding circuit, configured to detect a voltage difference between the first voltage and the second voltage, and generate the switch control signal based on the voltage difference.

2. The voltage holding device according to claim 1, wherein in an operation mode:
    after the voltage difference rises from 0 to a hysteresis voltage of the voltage difference detector, the voltage difference detector generates the switch control signal,
        wherein the first input end and the first output end of the first voltage holding circuit are turned on based on the switch control signal, and the second input end and the second output end of the second voltage holding circuit are turned on based on the switch control signal, wherein the first input-end voltage selection device selects the reference voltage as the first input voltage, and the second input-end voltage selection device selects the reference voltage as the second input voltage, so that the first voltage drops to the reference voltage and the second voltage rises to the reference voltage, and the voltage difference drops from the hysteresis voltage to 0; and
    after the voltage difference drops from the hysteresis voltage to 0, the voltage difference detector generates the switch control signal,
        wherein the first input end and the first output end of the first voltage holding circuit are turned off based on the switch control signal, and the second input end and the second output end of the second voltage holding circuit are turned off based on the switch control signal, and wherein the first input-end voltage selection device selects the system high voltage as the first input voltage, and the second input-end voltage selection device selects the system low voltage as the second input voltage to discharge the first capacitor via a leakage current of the first voltage holding circuit, and to discharge the second capacitor via the leakage current of the second voltage holding circuit, so that the first voltage rises from the reference voltage and the second voltage drops from the reference voltage, and the voltage difference rises from 0 to the hysteresis voltage.

3. The voltage holding device according to claim 1, wherein in a test mode:
    the first input end and the first output end of the first voltage holding circuit are turned on, and the second input end and the second output end of the second voltage holding circuit are turned on, so that the first input-end voltage selection device selects the system high voltage as the first input voltage and the second input-end voltage selection device selects the system low voltage as the second input voltage, then a first test of the first input-end voltage selection device, the second input-end voltage selection device and the voltage difference detector is performed;

after the first test is performed, the first input-end voltage selection device selects the reference voltage as the first input voltage, and the second input-end voltage selection device selects the reference voltage as the second input voltage, so that a second test of the first input-end voltage selection device, the second input-end voltage selection device and the voltage difference detector is performed; and after the second test is performed, the first input-end voltage selection device selects the test reference voltage as the first input voltage, and the second input-end voltage selection device selects the reference voltage as the second input voltage, so that a third test of the first input-end voltage selection device, the second input-end voltage selection device and the voltage difference detector is performed.

4. The voltage holding device according to claim 1, wherein the first input-end voltage selection device comprises:

a first selector and a second selector, wherein an output end of the first selector is electrically connected to the first input end, an input end of the first selector is electrically connected to the system high voltage, another input end of the first selector is electrically connected to an output end of the second selector, an input end of the second selector is electrically connected to the reference voltage, and another input end of the second selector is electrically connected to a test reference voltage.

5. The voltage holding device according to claim 1, wherein the second input-end voltage selection device comprises:

a third selector, wherein an output end of the third selector is electrically connected to the second input end, an input end of the third selector is electrically connected to the system low voltage, and another input end of the third selector is electrically connected to the reference voltage.

6. The voltage holding device according to claim 1, wherein the first voltage holding circuit comprises:

a first PMOS transistor, having a drain configured as the first input end, a gate configured to receive the switch control signal, and a source configured as the first output end; and the first capacitor.

7. The voltage holding device according to claim 1, wherein the second voltage holding circuit comprises:

a second PMOS transistor, having a drain configured as the second input end, a gate configured to receive the switch control signal, and a source configured as the second output end;

the second capacitor.

8. The voltage holding device according to claim 1, wherein the voltage difference detector is a hysteresis comparator.

9. The voltage holding device according to claim 1, wherein a period of the voltage difference dropping from the hysteresis voltage of the voltage difference detector to 0 is defined as a sampling period, and a period of the voltage difference rising from 0 to the hysteresis voltage is defined as a holding period, and wherein during the holding period, the first voltage rises from the reference voltage, and the second voltage drops from the reference voltage, and during the sampling period, the first voltage drops to the reference voltage, and the second voltage rises to the reference voltage.

10. An electronic apparatus, comprising:

a voltage holding device, comprising:

a first voltage holding circuit, comprising a first capacitor, a first input end and a first output end, wherein the first output end is configured to generate a first voltage, wherein the first capacitor is electrically connected between a low voltage and the first output end, and wherein a switch control signal is configured to turn on or off the first input end and the first output end;

a second voltage holding circuit, comprising a second capacitor, a second input end and a second output end, wherein the second output end is configured to generate a second voltage, wherein the second capacitor is electrically connected between the low voltage and the second output end, and wherein the switch control signal is configured to turn on or off the second input end and the second output end;

a first input-end voltage selection device, electrically connected to the first input end, and configured to selectively provide one of a reference voltage, a test reference voltage and a system high voltage for the first input end as a first input voltage;

a second input-end voltage selection device, electrically connected to the second input end, and configured to selectively provide one of a system low voltage and the reference voltage for the second input end as a second input voltage; and a voltage difference detector, electrically connected to the first voltage holding circuit and the second voltage holding circuit, configured to detect a voltage difference between the first voltage and the second voltage, and generate the switch control signal based on the voltage difference; and a system circuit, electrically connected to the voltage holding device.

11. The electronic apparatus according to claim 10, wherein in an operation mode:

after the voltage difference rises from 0 to a hysteresis voltage of the voltage difference detector, the voltage difference detector generates the switch control signal,
wherein the first input end and the first output end of the first voltage holding circuit are turned on based on the switch control signal, and the second input end and the second output end of the second voltage holding circuit are turned on based on the switch control signal,
wherein the first input-end voltage selection device selects the reference voltage as the first input voltage, and the second input-end voltage selection device selects the reference voltage as the second input voltage, so that the first voltage drops to the reference voltage and the second voltage rises to the reference voltage, and the voltage difference drops from the hysteresis voltage to 0; and after the voltage difference drops from the hysteresis voltage to 0, the voltage difference detector generates the switch control signal,
wherein the first input end and the first output end of the first voltage holding circuit are turned off based on the switch control signal, and the second input end and the second output end of the second voltage holding circuit are turned off based on the switch control signal, and wherein the first input-end voltage selection device selects the system high voltage as the first input voltage, and the second input-end voltage selection device selects the system low voltage as the second input voltage to discharge the first capacitor via a leakage current of the first voltage holding circuit, and to discharge the second capacitor via the leakage current of the second voltage holding circuit, so that the first voltage rises from the reference voltage and the second voltage drops from the reference voltage, and the voltage difference rises from 0 to the hysteresis voltage.

12. The electronic apparatus according to claim 10, wherein in a test mode:

the first input end and the first output end of the first voltage holding circuit are turned on, the second input end and the second output end of the second voltage holding circuit are turned on, so that the first input-end voltage selection device selects the system high voltage as the first input voltage and the second input-end voltage selection device selects the system low voltage as the second input voltage, then a first test of the first input-end voltage selection device, the second input-end voltage selection device and the voltage difference detector is performed;

after the first test is performed, the first input-end voltage selection device selects the reference voltage as the first input voltage, and the second input-end voltage selection device selects the reference voltage as the second input voltage, so that a second test of the first input-end voltage selection device, the second input-end voltage selection device and the voltage difference detector is performed; and after the second test is performed, the first input-end voltage selection device selects the test reference voltage as the first input voltage, and the second input-end voltage selection device selects the reference voltage as the second input voltage, so that a third test of the first input-end voltage selection device, the second input-end voltage selection device and the voltage difference detector is performed.

13. The electronic apparatus according to claim 10, wherein the first input-end voltage selection device comprises:

a first selector and a second selector, wherein an output end of the first selector is electrically connected to the first input end, an input end of the first selector is electrically connected to the system high voltage, another input end of the first selector is electrically connected to an output end of the second selector, an input end of the second selector is electrically connected to the reference voltage, and another input end of the second selector is electrically connected to a test reference voltage.

14. The electronic apparatus according to claim 10, wherein the second input-end voltage selection device comprises:

a third selector, wherein an output end of the third selector is electrically connected to the second input end, an input end of the third selector is electrically connected to the system low voltage, and another input end of the third selector is electrically connected to the reference voltage.

15. The electronic apparatus according to claim 10, wherein the first voltage holding circuit comprises:

a first PMOS transistor, wherein a drain of the first PMOS transistor is configured as the first input end, a gate of the first PMOS transistor is configured to receive the switch control signal, and a source of the first PMOS transistor is configured as the first output end; and the first capacitor.

16. The electronic apparatus according to claim 10, wherein the second voltage holding circuit comprises:

a second PMOS transistor, a drain of the second PMOS transistor is configured as the second input end, a gate of the second PMOS transistor is configured to receive the switch control signal, and a source of the second PMOS transistor is configured as the second output end; and the second capacitor.

17. The electronic apparatus according to claim 10, wherein the voltage difference detector is a hysteresis comparator.

18. The electronic apparatus according to claim 10, wherein a period of the voltage difference dropping from the hysteresis voltage of the voltage difference detector to 0 is defined as sampling period, and a period of the voltage difference rising from 0 to the hysteresis voltage is defined as holding period, and wherein during the holding period, the first voltage rises from the reference voltage, and the second voltage drops from the reference voltage, and during the sampling period, the first voltage drops to the reference voltage, and the second voltage rises to the reference voltage.

* * * * *